United States Patent
Hatch et al.

(10) Patent No.: US 11,812,553 B2
(45) Date of Patent: Nov. 7, 2023

(54) CONDUCTIVE TRACE INTERCONNECTION TAPE

(71) Applicant: Honeywell Federal Manufacturing & Technologies, LLC, Kansas City, MO (US)

(72) Inventors: Stephen McGarry Hatch, Blue Springs, MO (US); Jonathan Douglas Hatch, Cleveland, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 17/731,621

(22) Filed: Apr. 28, 2022

(65) Prior Publication Data

US 2022/0279653 A1 Sep. 1, 2022

Related U.S. Application Data

(62) Division of application No. 17/067,901, filed on Oct. 12, 2020, now Pat. No. 11,350,524, which is a
(Continued)

(51) Int. Cl.
*H05K 1/09* (2006.01)
*H05K 1/11* (2006.01)
(Continued)

(52) U.S. Cl.
CPC .............. *H05K 1/09* (2013.01); *H05K 1/118* (2013.01); *H05K 3/103* (2013.01); *H05K 1/0393* (2013.01);
(Continued)

(58) Field of Classification Search
CPC .......... H05K 1/09; H05K 1/118; H05K 3/103; H05K 2201/0335; H05K 2201/05;
(Continued)

(56) References Cited

U.S. PATENT DOCUMENTS 3,132,204 A 5/1964 Giellerup
3,168,617 A 2/1965 Richter
(Continued)

*Primary Examiner* — Ishwarbhai B Patel
(74) *Attorney, Agent, or Firm* — HOVEY WILLIAMS LLP

(57) ABSTRACT

A conductive trace interconnect tape for use with a printed circuit board or a flexible circuit substrate comprises a top insulating layer, an electrically conductive layer, and a bottom insulating layer. The top insulating layer is formed from electrically insulating material and is configured to provide electrical isolation from electrically conductive objects that are positioned on top of the conductive trace interconnect tape. The electrically conductive layer is positioned underneath the top insulating layer. The electrically conductive layer is formed from electrically conductive material and includes electrical interconnect traces, electrical component pads, or electrically conductive planar portions. The bottom insulating layer is positioned underneath the electrically conductive layer. The bottom insulating layer is formed from electrically insulating material and is configured to provide electrical isolation from electrically conductive objects that are positioned on the printed circuit board or flexible circuit substrate.

9 Claims, 5 Drawing Sheets

Related U.S. Application Data division of application No. 16/410,028, filed on May 13, 2019, now abandoned.

(51) Int. Cl.
  *H05K 1/18* (2006.01)
  *H05K 3/10* (2006.01)
  *H05K 1/03* (2006.01)

(52) U.S. Cl.
  CPC ............... *H05K 1/11* (2013.01); *H05K 1/189* (2013.01); *H05K 2201/0335* (2013.01); *H05K 2201/05* (2013.01); *H05K 2201/1028* (2013.01)

(58) Field of Classification Search
  CPC ........... H05K 2201/1028; H05K 3/363; H05K 3/046; H05K 1/141; H05K 1/0292; H05K 3/225; H05K 2203/173
  See application file for complete search history.

(56) References Cited

U.S. PATENT DOCUMENTS

| | | | | |
|---|---|---|---|---|
| 4,406,915 A | * | 9/1983 | Lang | H02G 1/1295 174/117 FF |
| 4,546,037 A | | 10/1985 | King | |
| 5,087,494 A | | 2/1992 | Calhoun et al. | |
| 5,274,195 A | | 12/1993 | Murphy et al. | |
| 6,049,041 A | * | 4/2000 | Yoshioka | H05K 1/09 174/117 FF |
| 6,333,466 B1 | | 12/2001 | Miyaake et al. | |
| 6,455,354 B1 | | 9/2002 | Jiang | |
| 6,469,252 B1 | | 10/2002 | Tanaka et al. | |
| 6,469,261 B2 | | 10/2002 | Yamanashi et al. | |
| 6,521,838 B2 | | 2/2003 | Yamanobe et al. | |
| 6,594,152 B2 | | 7/2003 | Dent | |
| 6,768,052 B2 | * | 7/2004 | Yamada | H05K 1/0218 174/394 |
| 6,811,409 B2 | | 11/2004 | Kurle et al. | |
| 7,091,422 B1 | * | 8/2006 | Stotz | H01B 7/0838 174/117 A |
| 7,205,482 B2 | * | 4/2007 | Naito | H01L 23/49572 174/117 FF |
| 7,442,074 B2 | * | 10/2008 | Shimoishizaka | H05K 3/242 439/493 |
| 7,921,403 B2 | * | 4/2011 | Dangler | H05K 1/024 716/132 |
| 9,782,686 B2 | | 10/2017 | Hellenga | |
| 9,795,035 B2 | | 10/2017 | Hatch et al. | |
| 9,949,380 B2 | | 4/2018 | Eifuku et al. | |
| 2009/0013526 A1 | * | 1/2009 | Yang | H05K 3/0097 174/250 |
| 2011/0024162 A1 | | 2/2011 | Oikawa | |
| 2014/0097021 A1 | * | 4/2014 | Su | H05K 9/00 174/72 R |
| 2014/0335341 A1 | | 11/2014 | Park et al. | |
| 2015/0359086 A1 | | 12/2015 | Su et al. | |

* cited by examiner

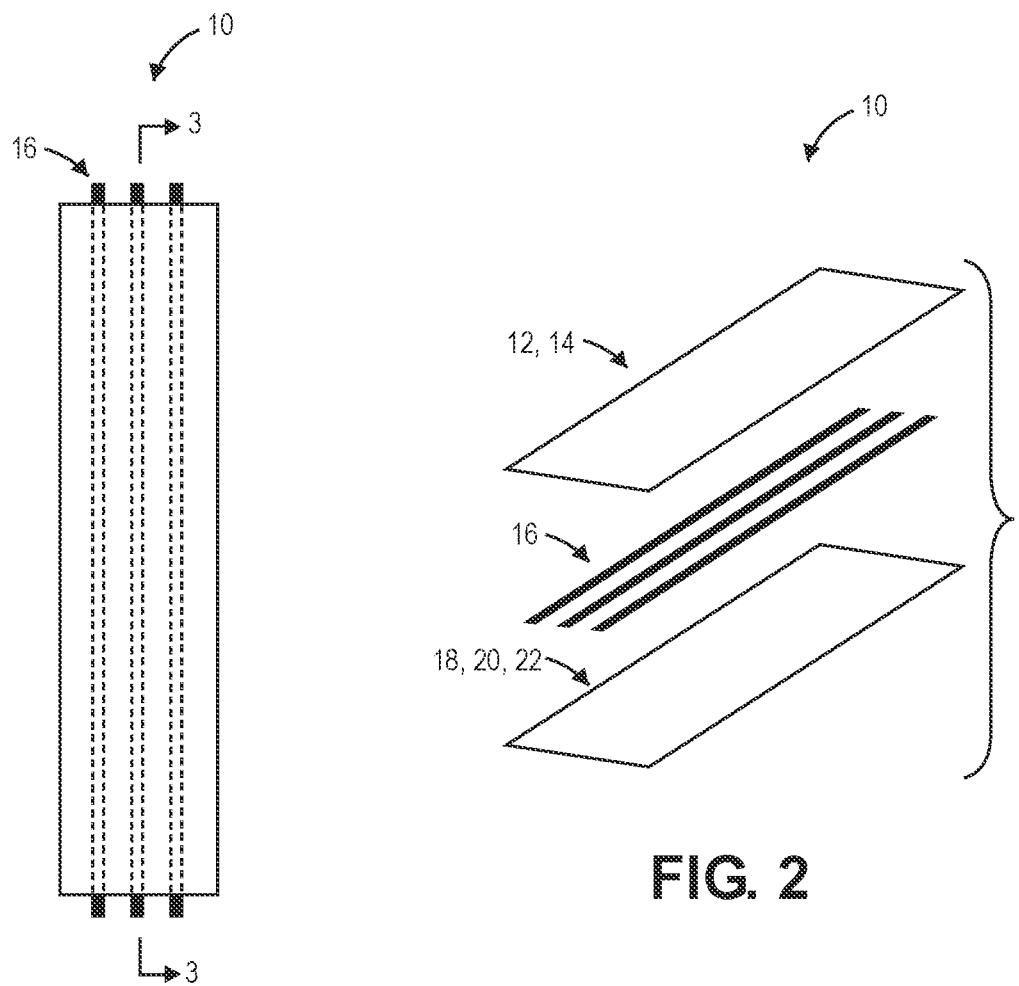
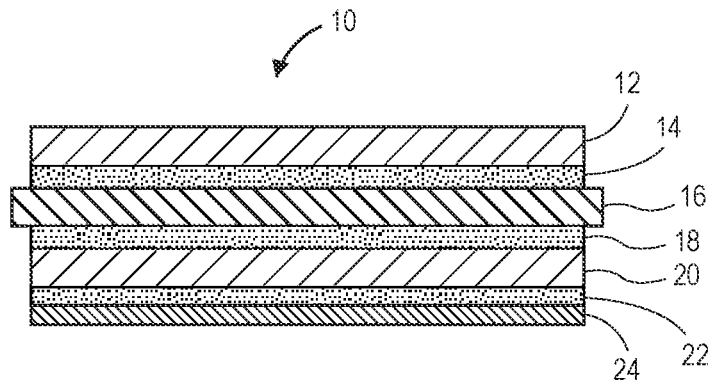

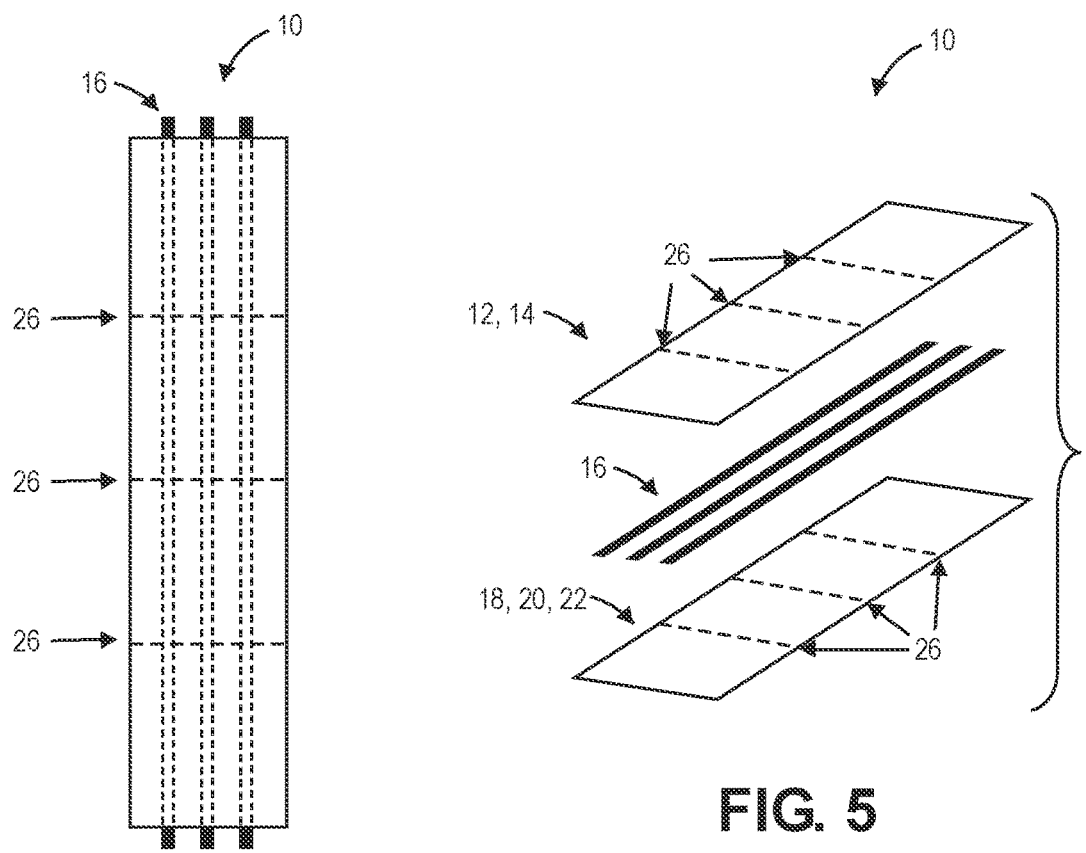
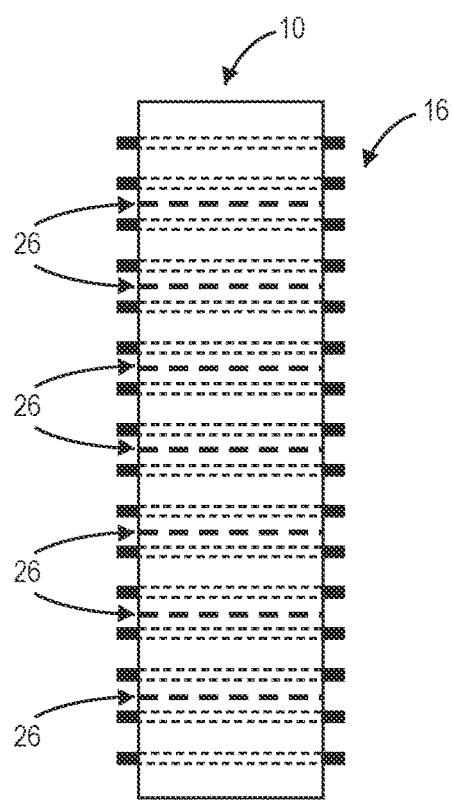

CONDUCTIVE TRACE INTERCONNECTION TAPE

RELATED APPLICATION

The current patent application is a divisional patent application claiming priority benefit, with regard to all common subject matter, to U.S. patent application Ser. No. 17/067,901, entitled "CONDUCTIVE TRACE INTERCONNECTION TAPE", and filed Oct. 12, 2020, which is a divisional patent application claiming priority benefit, with regard to all common subject matter, to U.S. patent application Ser. No. 16/410,028, entitled "CONDUCTIVE TRACE INTERCONNECTION TAPE", and filed May 13, 2019. The earlier-filed patent applications are hereby incorporated by reference, in their entireties, into the current document.

STATEMENT REGARDING FEDERALLY-SPONSORED RESEARCH OR DEVELOPMENT

This invention was made with Government support under Contract No.: DE-NA0002839 awarded by the United States Department of Energy/National Nuclear Security Administration. The Government has certain rights in the invention.

FIELD OF THE INVENTION

Embodiments of the current invention relate to materials that include electrically conductive traces which provide electrical interconnections.

DESCRIPTION OF THE RELATED ART

Printed circuit boards and flexible circuit substrates typically include at least one surface with an electrically conductive layer. Signal, power, and ground traces along with through-hole and surface-mount pads and component footprints are formed on the electrically conductive layer. Sometimes an error is made or a design change occurs after the printed circuit board or flexible circuit substrate has been fabricated which results in one or more traces being missing. In such a situation, a new printed circuit board or flexible circuit substrate with a correction has to be fabricated—leading to increased costs and additional fabrication time. In some situations, it is possible that the printed circuit board or flexible circuit substrate can be repaired by soldering one or more wires in place to correct for the missing traces. However, wires may stick up from the surface of the board or substrate and can possibly get caught on objects that come into contact with the board or substrate—reducing the reliability of such a solution.

SUMMARY OF THE INVENTION

Embodiments of the current invention solve the above-mentioned problems and provide a conductive trace interconnect tape that includes an electrically conductive layer capable of forming traces which can be cut and soldered in place to provide new traces on a printed circuit board or flexible circuit substrate. The traces can be implemented on the board or substrate for a low cost and with a quick turnaround time. In addition, the traces lie nearly flush on the surface of the printed circuit board or flexible circuit substrate. An embodiment of the conductive trace interconnect tape broadly comprises a top insulating layer, an electrically conductive layer, and a bottom insulating layer. The top insulating layer is formed from electrically insulating material and is configured to provide electrical isolation from electrically conductive objects that are positioned on top of the conductive trace interconnect tape. The electrically conductive layer is positioned underneath the top insulating layer. The electrically conductive layer is formed from electrically conductive material and includes electrical interconnect traces, electrical component pads, or electrically conductive planar portions. The bottom insulating layer is positioned underneath the electrically conductive layer. The bottom insulating layer is formed from electrically insulating material and is configured to provide electrical isolation from electrically conductive objects that are positioned on the printed circuit board or flexible circuit substrate.

Another embodiment of the current invention provides a conductive trace interconnect tape for use with a printed circuit board or a flexible circuit substrate. The conductive trace interconnect tape broadly comprises a top insulating layer, an electrically conductive layer, a bottom insulating layer, a top adhesive layer, a middle adhesive layer, and a bottom adhesive layer. The top insulating layer is formed from electrically insulating material and is configured to provide electrical isolation from electrically conductive objects that are positioned on top of the conductive trace interconnect tape. The electrically conductive layer is positioned underneath the top insulating layer. The electrically conductive layer is formed from electrically conductive material and includes electrical interconnect traces, electrical component pads, or electrically conductive planar portions. The bottom insulating layer is positioned underneath the electrically conductive layer. The bottom insulating layer is formed from electrically insulating material and is configured to provide electrical isolation from electrically conductive objects that are positioned on the printed circuit board or flexible circuit substrate. The top adhesive layer bonds a lower surface of the top insulating layer to an upper surface of the electrically conductive layer and an upper surface of the bottom insulating layer. The middle adhesive layer bonds a lower surface of the electrically conductive layer to an upper surface of the bottom insulating layer. The bottom adhesive layer bonds a lower surface of the bottom insulating layer to a surface of the printed circuit board or flexible circuit substrate.

Yet another embodiment of the current invention provides a conductive trace interconnect tape for use with a printed circuit board or a flexible circuit substrate. The conductive trace interconnect tape broadly comprises a top insulating layer, an electrically conductive layer, and a bottom insulating layer. The top insulating layer has an elongated rectangular shape. The top insulating layer is formed from electrically insulating material and is configured to provide electrical isolation from electrically conductive objects that are positioned on top of the conductive trace interconnect tape. The electrically conductive layer is positioned underneath the top insulating layer. The electrically conductive layer is formed from electrically conductive material and includes a plurality of spaced-apart electrical interconnect traces. The bottom insulating layer has an elongated rectangular shape and is positioned underneath the electrically conductive layer. The bottom insulating layer is formed from electrically insulating material and is configured to provide electrical isolation from electrically conductive objects that are positioned on the printed circuit board or flexible circuit substrate.

BRIEF DESCRIPTION OF THE DRAWING FIGURES

Embodiments of the current invention are described in detail below with reference to the attached drawing figures, wherein:

FIG. 1 is a top view of a conductive trace interconnect tape, constructed in accordance with at least one embodiment of the current invention;

FIG. 2 is an exploded perspective view of the conductive trace interconnect tape, illustrating a top insulating layer, an electrically conductive layer, and a bottom insulating layer;

FIG. 3 is a cross-sectional view of the conductive trace interconnect tape, cut along the line 3-3 of FIG. 1;

FIG. 4 is a top view of an embodiment of the conductive trace interconnect tape that includes perforations in at least the top insulating layer;

FIG. 5 is an exploded perspective view of the embodiment of the conductive trace interconnect tape of FIG. 4;

FIG. 6 is a top view of an embodiment of the conductive trace interconnect tape in which the electrically conductive layer includes a plurality of spaced-apart traces oriented transverse to a longitudinal axis of the conductive trace interconnect tape;

Figure 7:
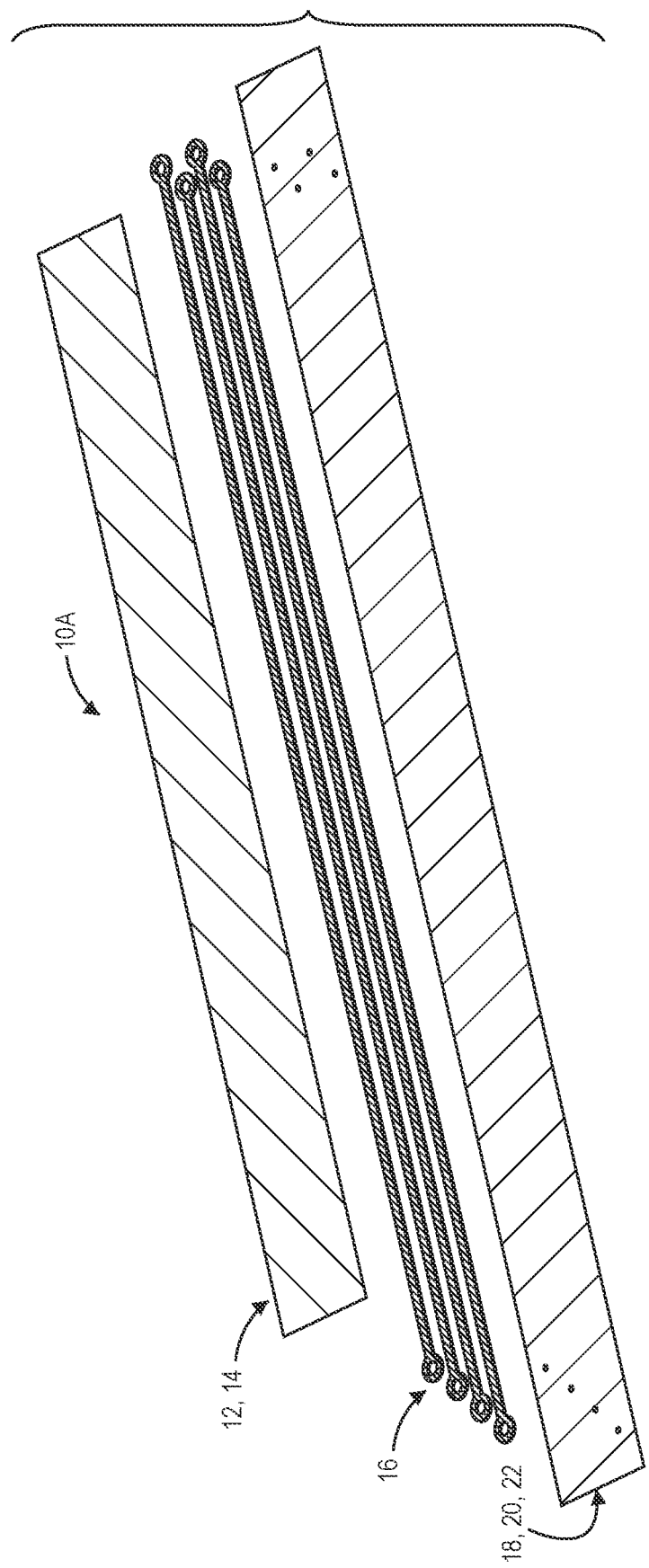
FIG. 7 is an exploded perspective view of an embodiment of the conductive trace interconnect tape in which the electrically conductive layer includes a pattern of signals and pads.
Figure 8:
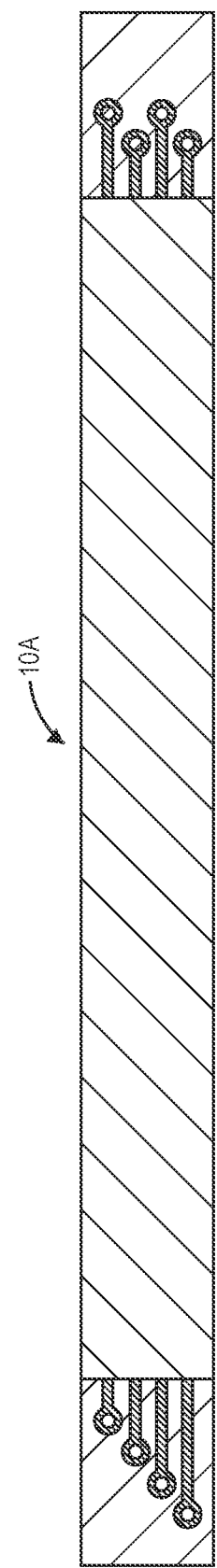
FIG. 8 is a top view of the embodiment of the conductive trace interconnect tape of FIG. 7.
Figure 9:
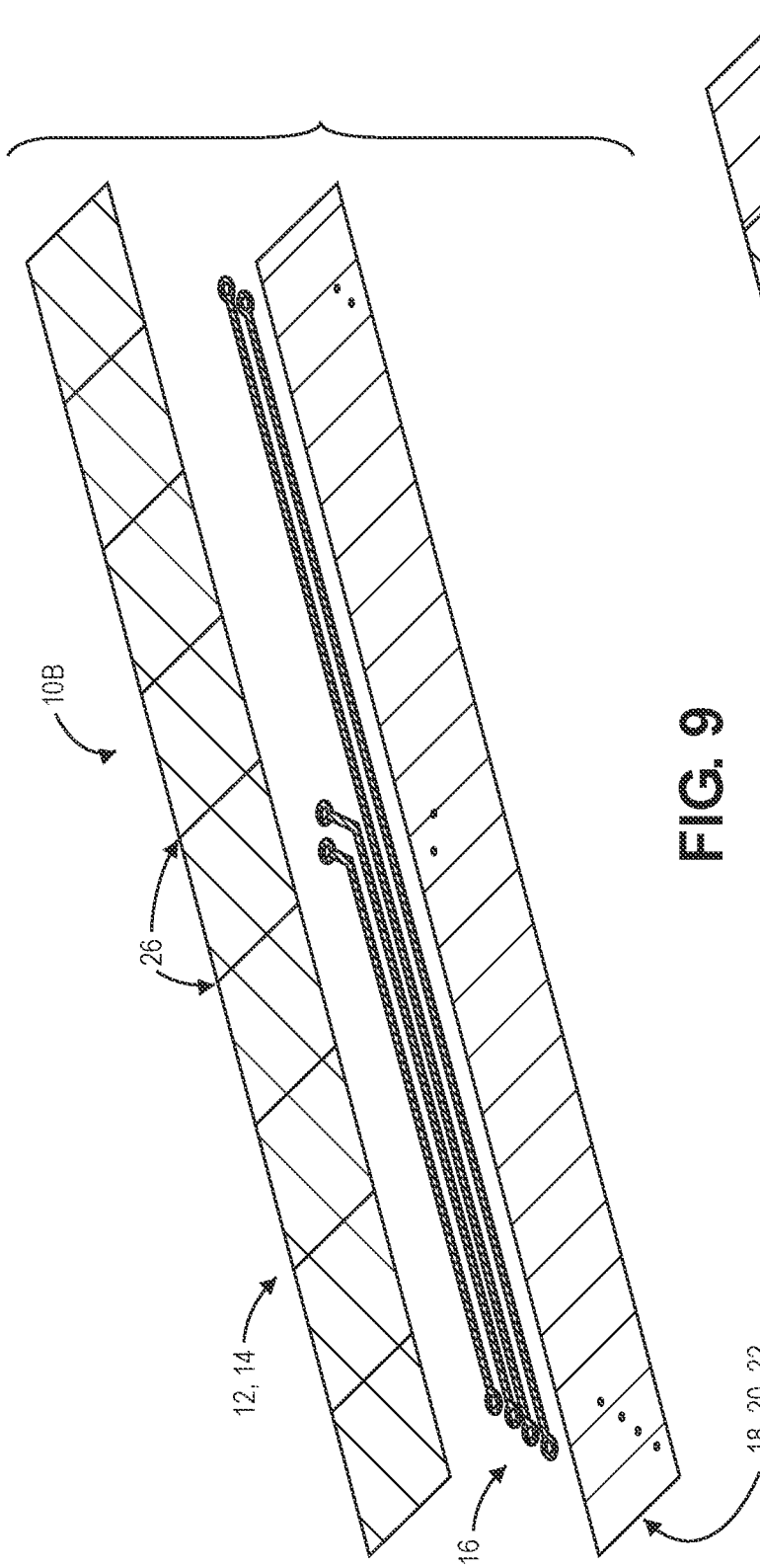
FIG. 9 is an exploded perspective view of an embodiment of the conductive trace interconnect tape in which the top insulating layer includes a plurality of spaced-apart linear perforations and the electrically conductive layer includes another pattern of signals and pads.
Figure 10:
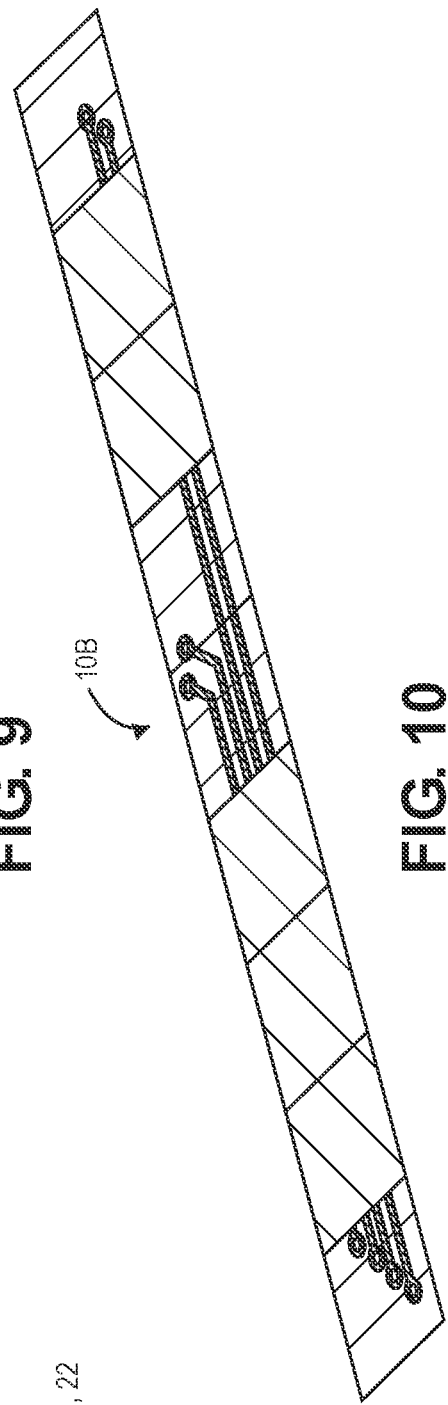
FIG. 10 is a perspective view of the embodiment of the conductive trace interconnect tape of FIG. 9 with some sections of the top insulating layer removed.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

A conductive trace interconnection tape 10, constructed in accordance with various embodiments of the current invention, is shown in FIGS. 1-10. The conductive trace interconnect tape 10 may be utilized to provide electrical interconnection on a printed circuit board or a flexible circuit substrate.

The conductive trace interconnect tape 10 broadly comprises a top insulating layer 12, a top adhesive layer 14, an electrically conductive layer 16, a middle adhesive layer 18, a bottom insulating layer 20, and a bottom adhesive layer 22. In some embodiments, the conductive trace interconnect tape 10 may optionally include a base layer 24.

The top insulating layer 12 provides electrical isolation from electrically conductive objects, such as electrically conductive traces, electronic components, etc., that may be positioned on top of the conductive trace interconnect tape 10. The top insulating layer 12 may be formed from electrically insulating or dielectric materials, such as flexible plastic, polyester, or any other suitable flexible material—particularly materials that can withstand high temperature. For example, the top insulating layer 12 may be formed of Mylar, Kapton, polyimide, polyether ether ketone, or a similar material. In various embodiments shown in FIGS. 4-8, the top insulating layer 12 may include spaced-apart lines of perforations 26 along the width of the layer 12, or transverse to the longitudinal axis of the top insulating layer 12. The perforations 26 allow for sections of the top insulating layer 12 to be removed from the conductive trace interconnect tape 10. The top insulating layer 12 may alternatively or additionally include perforations 26 that form other patterns.

The top adhesive layer 14 bonds a lower surface of the top insulating layer 12 to an upper surface of the electrically conductive layer 16 and an upper surface of the bottom insulating layer 20. The top adhesive layer 14 may include adhesives or other bonding materials with moderate adherence between surfaces to which it is applied. That is, the top adhesive layer 14 should maintain the top insulating layer 12 on top of the electrically conductive layer 16, but allow for the top insulating layer 12 to be removed, if desired.

The electrically conductive layer 16 is formed from electrically conductive materials, particularly metals, including copper, aluminum, nickel, gold, alloys thereof, and the like. The electrically conductive layer 16 includes signal traces, electric power and ground lines, full or partial electric power and ground planes, through-hole and surface-mount package pads, circuit interconnect geometry, and the like.

The middle adhesive layer 18 bonds a lower surface of the electrically conductive layer 16 to an upper surface of the bottom insulating layer 20. The middle adhesive layer 18 may include adhesives or other bonding materials that prevent the electrically conductive layer 16 from lifting off of the bottom insulating layer 20—particularly in situations when the top insulating layer 12 has been removed.

The bottom insulating layer 20 provides electrical isolation from electrically conductive objects that may be positioned underneath the conductive trace interconnect tape 10. Like the top insulating layer 12, the bottom insulating layer 20 may be formed from electrically insulating or dielectric materials, such as high-temperature flexible plastic, polyester, or any other suitable high-temperature flexible material. In some embodiments shown in FIGS. 4-8, the bottom insulating layer 20 may include spaced-apart lines of perforations 26 along the width of the layer 20. The bottom insulating layer 20 may alternatively or additionally include perforations 26 that form other patterns.

The bottom adhesive layer 22 bonds a lower surface of the bottom insulating layer 20 to a surface of a printed circuit board or flexible circuit substrate. The bottom adhesive layer 22 may include adhesives or other bonding materials that strongly bond the bottom insulating layer 20, and by extension the conductive trace interconnect tape 10, to the printed circuit board or flexible circuit substrate.

The base layer 24 provides a base that covers the bottom adhesive layer 22 to allow the conductive trace interconnect tape 10 to be handled before the conductive trace interconnect tape 10 is utilized or applied to a printed circuit board or flexible circuit substrate. The top insulating layer 12 may be formed from electrically insulating materials that include a non-stick surface The conductive trace interconnect tape 10 may be formed in any one of a plurality of ways. One method of forming the conductive trace interconnect tape 10 may include forming strips of electrically conductive layer 16 material (metal) and placing the strips on a first film that includes the middle adhesive layer 18, the bottom insulating layer 20, the bottom adhesive layer 22, and the base layer 24, positioned one on top of another to form a stack. A second film that includes the top insulating layer 12 and the top adhesive layer 14 may be placed on top of the electrically conductive layer 16. Pressure and/or heating may be applied to the combination of the first film, the strips, and the second film. In some embodiments, opposing ends of the strips of the electrically conductive layer 16 may extend beyond the edges of the first film and the second film, as shown in FIGS. 1-6. In some embodiments, the top insulating layer 12 and/or the bottom insulating layer 20 may include perforations 26 that form spaced-apart lines or other patterns, such as lines adjacent to one or more edges of the layers 12, 20.

Another method of forming the conductive trace interconnect tape 10 may utilize the processes described in U.S. Pat. No. 9,504,148, entitled "RAPID PCB PROTOTYPING BY SELECTIVE ADHESION", and issued Nov. 22, 2016, the contents of which is incorporated by reference in its entirety into the current patent application. The processes involve using a film with a curable adhesive that is applied to a sheet of the electrically conductive layer 16 which is positioned on top of a stack of the middle adhesive layer 18 and the bottom adhesive layer 22. The stack may further include the bottom adhesive layer 22 and the base layer 24. The curable adhesive is patterned and cured to form a bond between the patterned area of curable adhesive film and the electrically conductive layer 16. The film is then removed from the electrically conductive layer 16 which leaves metal remaining in selected areas. This process can be used to form not only conductive traces, substantially the same as the conductive strips discussed above, but also more complex patterns such as those shown in FIGS. 7-12. The patterns may include full or partial electric power and ground planes, through-hole and surface-mount package pads, circuit interconnect geometry, and the like. After the electrically conductive layer 16, the middle adhesive layer 18, the bottom insulating layer 20, the bottom adhesive layer 22, and the base layer 24 are formed as described, a film of the top insulating layer 12 and the top adhesive layer 14 may be placed on top of the electrically conductive layer 16.

The conductive trace interconnect tape 10 may be utilized or implemented as follows. Referring to FIGS. 7-10, the electrically conductive layer 16 including patterns of signal or power traces and pads may be formed on the middle adhesive layer 18, the bottom insulating layer 20, the bottom adhesive layer 22, and the base layer 24 as discussed above. The top insulating layer 12 and the top adhesive layer 14 may be placed on top of the electrically conductive layer 16 to form the conductive trace interconnect tape 10. In an exemplary first conductive trace interconnect tape 10A shown in FIGS. 7 and 8, the top insulating layer 12 and the top adhesive layer 14 may be smaller or shorter in at least one dimension to expose the pads to which solder will be applied. In an exemplary second conductive trace interconnect tape 10B shown in FIGS. 9 and 10, the top insulating layer 12 may include a plurality of spaced-apart lines of perforations 26. The conductive trace interconnect tapes 10A, 10B may have the base layer 24 removed and may be placed on a surface of a printed circuit board or flexible circuit substrate in a desired location. The bottom adhesive layer 22 bonds with the surface of the printed circuit board or flexible circuit substrate. In some embodiments, some sections of the top insulating layer 12 (and the top adhesive layer 14) may be removed by pulling them from the electrically conductive layer 16 and the bottom insulating layer 20. Electronic components may then be soldered to the exposed electrically conductive layer 16 traces and/or pads.

Figure 11:
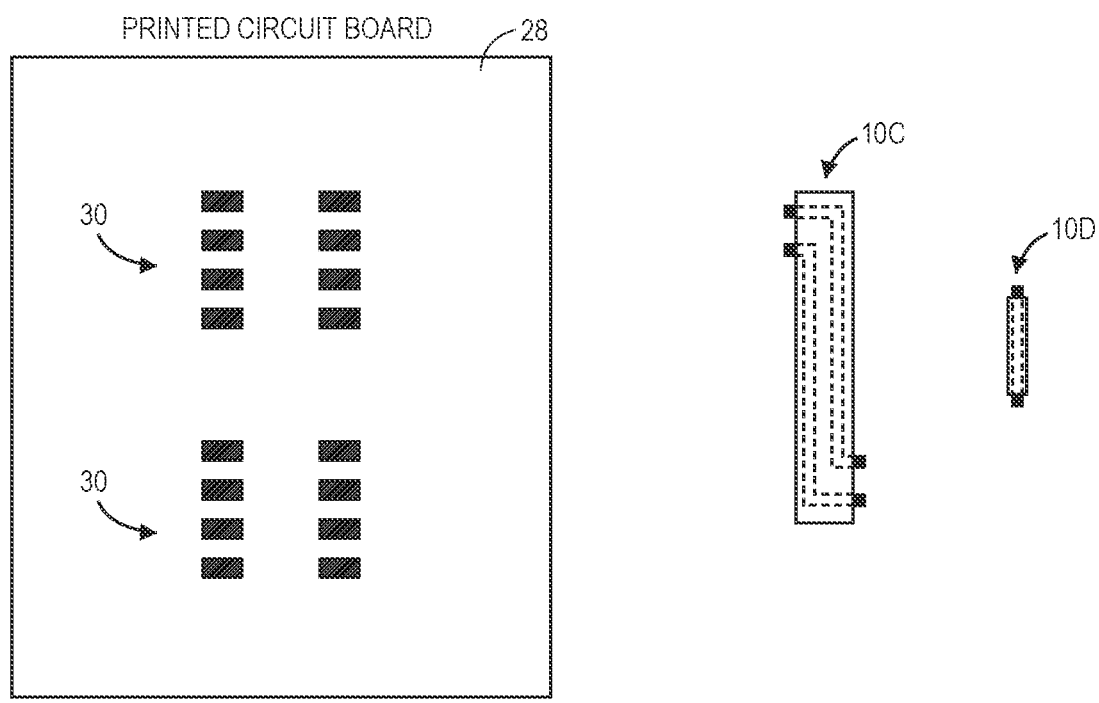
FIG. 11 is a top view of two additional embodiments of the conductive trace interconnect tape and a printed circuit board that includes two surface-mount component footprints.
Figure 12:
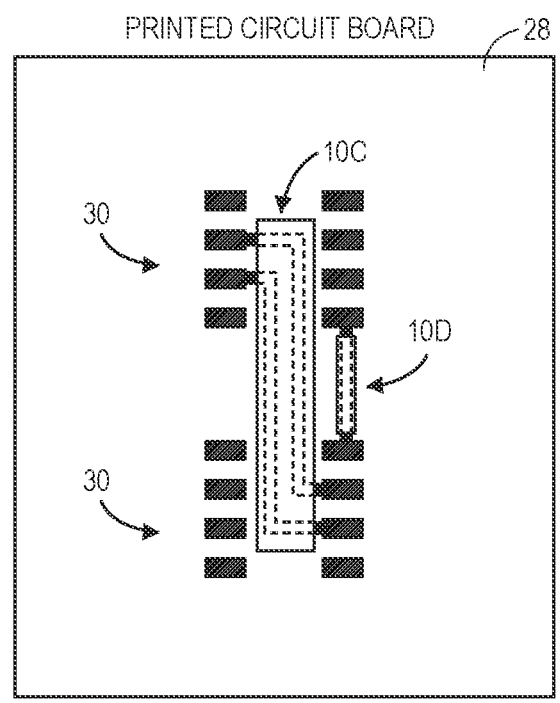
FIG. 12 is a top view of the printed circuit board with the two conductive trace interconnect tapes placed and bonded on the printed circuit board.

Referring to FIGS. 11 and 12, a printed circuit board 28 (or flexible circuit substrate) may include surface mount (or, additionally or alternatively, through-hole) pads for a packaged integrated circuit, or passive or active components. In the examples of FIGS. 11 and 12, there are two eight-pad surface mount component footprints 30 already placed. Typically, the printed circuit board 28 already includes signal, power, or ground traces that are necessary to connect the pads of the packages to other circuit components. However, due to error, design change, or upgrades, there may be traces that are missing. An exemplary third conductive trace interconnect tape 10C and an exemplary fourth conductive trace interconnect tape 10D may be utilized to add traces. The third conductive trace interconnect tape 10C may be formed using the second method described above, while the fourth conductive trace interconnect tape 10D may be formed using the first method described above. In one embodiment, the fourth conductive trace interconnect tape 10D may be formed by cutting one of the conductive strips from the conductive trace interconnect tape 10 of FIG. 1, 4, or 6. The third conductive trace interconnect tape 10C and the fourth conductive trace interconnect tape 10D may be placed on the printed circuit board 28 in alignment with the appropriate pads. The bottom adhesive layer 22 bonds to the surface of the printed circuit board 28. The traces of the conductive trace interconnect tapes 10C, 10D may then be soldered to the pads.

Given that the conductive trace interconnect tape 10 includes both the bottom insulating layer 20 and the top insulating layer 12, it is possible to place one conductive trace interconnect tape 10 on top of another conductive trace interconnect tape 10 in order to create a multi-layer stack without the concern of the electrically conductive layers 16 touching one another and causing an electrical short. Thus, signal, power, and ground traces can be placed one on top of another or crossing one another safely to effectively create a multi-layer printed circuit board or flexible circuit substrate without the cost and fabrication time required for traditional multi-layer processes. Furthermore, since component pads and footprints can also be created with the conductive trace interconnect tape 10, all of the electrically conductive layers of a printed circuit board or flexible circuit substrate can be generated using one or more conductive trace interconnect tapes 10. Thus, all that is necessary to produce a printed circuit board or flexible circuit substrate that is ready to be populated with components is a blank board or substrate. The one or more conductive trace interconnect tapes 10 can be placed on and bonded to the board or substrate to form a customized board or substrate that is ready to receive electronic components.

It is also possible to produce the conductive trace interconnect tape 10 as a roll of "tape", wherein the conductive trace interconnect tape 10 is formed in elongated strips such as the embodiments shown in FIG. 1, 4, or 6. A plurality of spaced-apart traces may be formed in the electrically conductive layer 16 so that the traces are parallel or transverse to the longitudinal axis of the conductive trace interconnect tape 10. A desired length of conductive trace interconnect tape 10 may be pulled off or cut for usage. In addition, the conductive trace interconnect tape 10 may be cut to acquire just one trace if desired. Alternatively, a sheet of conductive trace interconnect tape 10 may be produced. The sheet may include a plurality of spaced-apart traces. The sheet may be cut to acquire the desired number and length of traces.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A conductive trace interconnect tape for use with a printed circuit board or a flexible circuit substrate, the conductive trace interconnect tape comprising:
   a top insulating layer formed from electrically insulating material and configured to provide electrical isolation from electrically conductive objects that are positioned on top of the conductive trace interconnect tape, the top insulating layer having a length greater than a width, the top insulating layer including a plurality of first perforations spaced apart from one another and oriented along the width and transverse to the length, each of the first perforations including a series of linearly-aligned through holes in the top insulating layer, the first perforations forming a plurality of top insulating layer sheets such that one or more top insulating layer sheets are selectively removable from the conductive trace interconnect tape;
   an electrically conductive layer positioned underneath the top insulating layer, the electrically conductive layer formed from electrically conductive material and including a plurality of electrical interconnect traces spaced apart from one another and oriented along the length of the top insulating layer and transverse to the width of the top insulating layer; and
   a bottom insulating layer positioned underneath the electrically conductive layer, the bottom insulating layer formed from electrically insulating material and configured to provide electrical isolation from electrically conductive objects that are positioned on the printed circuit board or flexible circuit substrate, the bottom insulating layer having a length greater than a width, the bottom insulating layer including a plurality of second perforations spaced apart from one another and oriented along the width and transverse to the length, each of the second perforations including a series of linearly-aligned through holes in the bottom insulating layer, the second perforations forming a plurality of bottom insulating layer sheets such that one or more bottom insulating layer sheets are selectively removable from the conductive trace interconnect tape.

2. The conductive trace interconnect tape of claim 1, further comprising a top adhesive layer that bonds a lower surface of the top insulating layer to an upper surface of the electrically conductive layer and an upper surface of the bottom insulating layer.

3. The conductive trace interconnect tape of claim 1, further comprising a bottom adhesive layer that bonds a lower surface of the bottom insulating layer to a surface of the printed circuit board or flexible circuit substrate.

4. The conductive trace interconnect tape of claim 1, further comprising a middle adhesive layer that bonds a lower surface of the electrically conductive layer to an upper surface of the bottom insulating layer.

5. The conductive trace interconnect tape of claim 1, wherein each electrical interconnect trace includes a first end which extends beyond a first end edge of the top insulating layer and a first end edge of the bottom insulating layer and an opposing second end which extends beyond an opposing second end edge of the top insulating layer and an opposing second end edge of the bottom insulating layer.

6. The conductive trace interconnect tape of claim 1, wherein portions of the top insulating layer are selectively removable from the conductive trace interconnect tape.

7. A conductive trace interconnect tape for use with a printed circuit board or a flexible circuit substrate, the conductive trace interconnect tape comprising:
- a top insulating layer formed from electrically insulating material and configured to provide electrical isolation from electrically conductive objects that are positioned on top of the conductive trace interconnect tape, the top insulating layer having a length greater than a width, the top insulating layer including a plurality of first perforations spaced apart from one another and oriented along the width and transverse to the length, each of the first perforations including a series of linearly-aligned through holes in the top insulating layer, the first perforations forming a plurality of top insulating layer sheets such that one or more top insulating layer sheets are selectively removable from the conductive trace interconnect tape;
- an electrically conductive layer positioned underneath the top insulating layer, the electrically conductive layer formed from electrically conductive material and including a plurality of electrical interconnect traces spaced apart from one another and oriented along the length of the top insulating layer and transverse to the width of the top insulating layer;
- a bottom insulating layer positioned underneath the electrically conductive layer, the bottom insulating layer formed from electrically insulating material and configured to provide electrical isolation from electrically conductive objects that are positioned on the printed circuit board or flexible circuit substrate, the bottom insulating layer having a length greater than a width, the bottom insulating layer including a plurality of second perforations spaced apart from one another and oriented along the width and transverse to the length, each of the second perforations including a series of linearly-aligned through holes in the bottom insulating layer, the second perforations forming a plurality of bottom insulating layer sheets such that one or more bottom insulating layer sheets are selectively removable from the conductive trace interconnect tape;
- a top adhesive layer that bonds a lower surface of the top insulating layer to an upper surface of the electrically conductive layer and an upper surface of the bottom insulating layer;
- a middle adhesive layer that bonds a lower surface of the electrically conductive layer to an upper surface of the bottom insulating layer; and
- a bottom adhesive layer that bonds a lower surface of the bottom insulating layer to a surface of the printed circuit board or flexible circuit substrate.

8. The conductive trace interconnect tape of claim 7, wherein each electrical interconnect trace includes a first end which extends beyond a first end edge of the top insulating layer and a first side edge of the bottom insulating layer and an opposing second end which extends beyond an opposing second end edge of the top insulating layer and an opposing second side edge of the bottom insulating layer.

9. The conductive trace interconnect tape of claim 7, wherein portions of the top insulating layer are selectively removable from the conductive trace interconnect tape.

* * * * *